United States Patent
He

(10) Patent No.: US 11,289,516 B2
(45) Date of Patent: Mar. 29, 2022

(54) ARRAY SUBSTRATE FABRICATION METHOD, ARRAY SUBSTRATE, AND DISPLAY PANEL

(71) Applicant: HKC CORPORATION LIMITED, Guangdong (CN)

(72) Inventor: Huailiang He, Guangdong (CN)

(73) Assignee: HKC CORPORATION LIMITED, Guangdong (CN)

( * ) Notice: Subject to any disclaimer, the term of this patent is extended or adjusted under 35 U.S.C. 154(b) by 0 days.

(21) Appl. No.: 17/043,678

(22) PCT Filed: Dec. 19, 2018

(86) PCT No.: PCT/CN2018/121895
§ 371 (c)(1),
(2) Date: Sep. 30, 2020

(87) PCT Pub. No.: WO2020/113681
PCT Pub. Date: Jun. 11, 2020

(65) Prior Publication Data
US 2021/0036030 A1    Feb. 4, 2021

(30) Foreign Application Priority Data
Dec. 5, 2018   (CN) .......................... 201811484872.4

(51) Int. Cl.
*H01L 27/12* (2006.01)
*H01L 21/02* (2006.01)

(52) U.S. Cl.
CPC ...... *H01L 27/1244* (2013.01); *H01L 27/1248* (2013.01); *H01L 27/1259* (2013.01); *H01L 21/02068* (2013.01)

(58) Field of Classification Search
None
See application file for complete search history.

(56) References Cited

U.S. PATENT DOCUMENTS

| 2010/0176486 | A1 | 7/2010 | Miyajima et al. |
| 2011/0204024 | A1* | 8/2011 | Moriya ........... B24B 37/005 216/37 |
| 2016/0307990 | A1* | 10/2016 | Kwon ........... H01L 27/1255 |

FOREIGN PATENT DOCUMENTS

| CN | 1963671 A * | 5/2007 |
| CN | 101676781 A | 3/2010 |
| CN | 102122649 A | 7/2011 |
| CN | 104064567 A | 9/2014 |
| CN | 106057851 A | 10/2016 |
| CN | 106653749 A | 5/2017 |
| CN | 107167970 A | 9/2017 |

(Continued)

OTHER PUBLICATIONS

Translation of CN 107579040 (Year: 2018).*
(Continued)

*Primary Examiner* — Bo B Jang

(57) ABSTRACT

Disclosed is an array substrate. The array substrate includes a display area and a terminal area defined at an edge of the display area; a plurality of thin film transistors are arranged in the display area, and a plurality of driving terminals are arranged at intervals in the terminal area; the driving terminals are electrically connected to the thin film transistors; an insulated film is arranged above an interval area of the driving terminals, to shield the interval area.

17 Claims, 3 Drawing Sheets

(56) References Cited

FOREIGN PATENT DOCUMENTS

| | | | |
|---|---|---|---|
| CN | 107238962 | A | 10/2017 |
| CN | 107579040 | A | 1/2018 |
| CN | 107706156 | A | 2/2018 |
| CN | 107784952 | A | 3/2018 |
| CN | 207474465 | U | 6/2018 |
| CN | 108258026 | A | 7/2018 |
| CN | 108389868 | A | 8/2018 |
| JP | 2012234213 | A | 11/2012 |

OTHER PUBLICATIONS

Translation of CN 107167970 (Year: 2017).*
AGC, "New Fluoropolymer Developed as a Photoresist Material for Next-Generation Semiconductors," 2001, total pp. 3 (Year: 2001).*
Excerpted portion of Hybrid Microcircuit Technology Handbook, Second Edition (Chapter 3, Thin Film Processes), 1998, pp. 9-12 of total pp. 15 (Year: 1998).*
First Office Action in counterpart Chinese Application No. 201811484872.4, dated May 18, 2020.
The Second Office Action in counterpart Chinese Application No. 201811484872.4, dated Oct. 22, 2020.
International Search Report in corresponding PCT Application No. PCT/CN2018/121895, dated Aug. 28, 2019.
Written Opinion of the International Searching Authority in corresponding PCT Application No. PCT/CN2018/121895, dated Aug. 28, 2019.

* cited by examiner

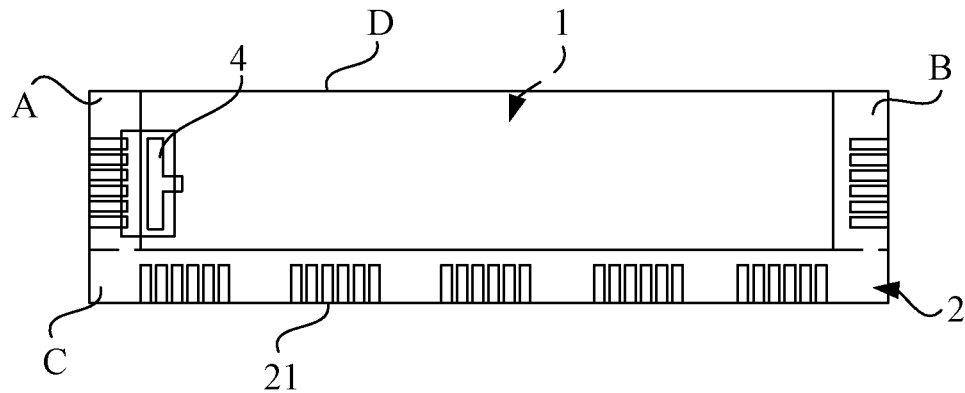

FIG. 1

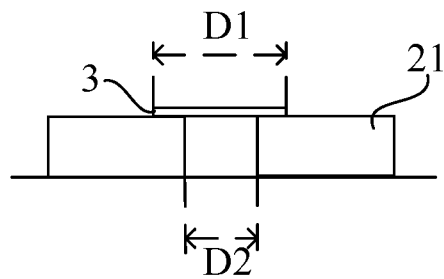

FIG. 2

| depositing a metal layer on the array substrate, to form a plurality of driving terminals arranged at intervals in a terminal area of the array substrate | S10 |

| coating an insulated photoresist on a side of the array substrate where the plurality of the driving terminals are arranged, exposing, developing and baking the insulated photoresist, to form an insulated film above an interval area of the plurality of driving terminals | S20 |

FIG. 3

ARRAY SUBSTRATE FABRICATION METHOD, ARRAY SUBSTRATE, AND DISPLAY PANEL

CROSS-REFERENCE TO RELATED DISCLOSURES

The present disclosure is the National Stage of International Application No. PCT/CN2018/121895, filed Dec. 19, 2018, which claims the benefit of Chinese Patent Application No. 201811484872.4, filed Dec. 5, 2018 with the National Intellectual Property Administration and entitled "ARRAY SUBSTRATE FABRICATION METHOD, ARRAY SUBSTRATE, AND DISPLAY PANEL", the entirety of which is hereby incorporated herein by reference.

TECHNICAL FIELD

The present disclosure relates to the field of liquid crystal panel, and more particularly relates to an array substrate fabrication method, an array substrate, and a display panel.

BACKGROUND

The statement herein merely provides background information related to the present disclosure and does not necessarily constitute the existing technology.

Liquid Crystal Display (LCD) technology is becoming more and more developed. In a display panel, driving terminals are electrically connected to a thin film transistor (TFT), to apply voltages to the TFT. For the purpose of high resolution frequency and high resolution of the display panel, the wirings of each driving terminal are generally intensively arranged.

However, since the area between two adjacent driving terminals is narrow, particles such as dust are easily accumulated in the narrow area, which may cause an electric connection between the two adjacent driving terminals, namely, a short circuit occurs between the two adjacent driving terminals.

SUMMARY

The present disclosure is to provide an array substrate fabrication method, an array substrate, and a display panel, aiming to reduce the occurrence of a short circuit between the driving terminals caused by particles such as dust accumulated in the narrow area between the driving terminals.

In one aspect, the present disclosure provides an array substrate, including a display area, and a terminal area defined at an edge of the display area; a plurality of thin film transistors are arranged in the display area, and a plurality of driving terminals are arranged at intervals in the terminal area; the plurality of the driving terminals are electrically connected to the plurality of the thin film transistors; an insulated film is arranged above an interval area of the plurality of driving terminals, to block the interval area.

In another one aspect, the present disclosure also provides a display panel, including an array substrate. The array substrate includes a display area and a terminal area defined at an edge of the display area. A plurality of thin film transistors are arranged in the display area, and a plurality of driving terminals are arranged at intervals in the terminal area. The plurality of the driving terminals are electrically connected to the plurality of the thin film transistors. An insulated film is arranged above an interval area of the driving terminals, to shield the interval area.

In accordance with the present disclosure, the array substrate includes a display area and a terminal area defined at an edge of the display area. A plurality of thin film transistors are arranged in the display area, and a plurality of driving terminals are arranged at intervals in the terminal area. The driving terminals are electrically connected with the thin film transistors. An insulated film is arranged above an interval area of the plurality of driving terminals, so as to block the interval area. By arranging the insulted films above the interval area of the driving terminals, particles such as dust can be shielded from falling into the interval area, thereby reducing the occurrence of short circuit between the driving terminals.

In still another one aspect, the present disclosure also provides an array substrate fabrication method, including:

depositing a metal layer on the array substrate, to form a plurality of driving terminals arranged at intervals in a terminal area of the array substrate; and coating an insulated photoresist on a side of the array substrate where the plurality of the driving terminals are arranged, exposing, developing, and baking the insulated photoresist, to form an insulated film above an interval area of the plurality of driving terminals.

In accordance with the present disclosure, a metal layer is deposited on the array substrate, to form a plurality of driving terminals arranged at intervals in the terminal area of the array substrate. An insulated photoresist is coated on a side of the array substrate where the driving terminals are arranged. The insulated photoresist is exposed, developed, and baked, to form an insulated film arranged above the interval area of the driving terminals, which can prevent particles such as dust from falling into the interval area, thereby reducing the occurrence of short circuit between the driving terminals.

BRIEF DESCRIPTION OF THE DRAWINGS

In order to illustrate the technical solution in the embodiments of the present disclosure or the prior art more clearly, brief description would be made below to the drawings required in the embodiments of the present disclosure or the prior art. Obviously, the drawings in the following description are merely some of the embodiments of the present disclosure, and those skilled in the art could obtain other drawings according to the structures shown in the drawings without any creative efforts.

FIG. 1 is a structure diagram of an array substrate according to the present disclosure.

FIG. 2 is a structure diagram of a driving terminal and an insulated film according to the present disclosure.

FIG. 3 is a flowchart diagram illustrating an array substrate fabrication method according to an embodiment of the present disclosure.

DETAILED DESCRIPTION OF THE EMBODIMENTS

Figure 4:
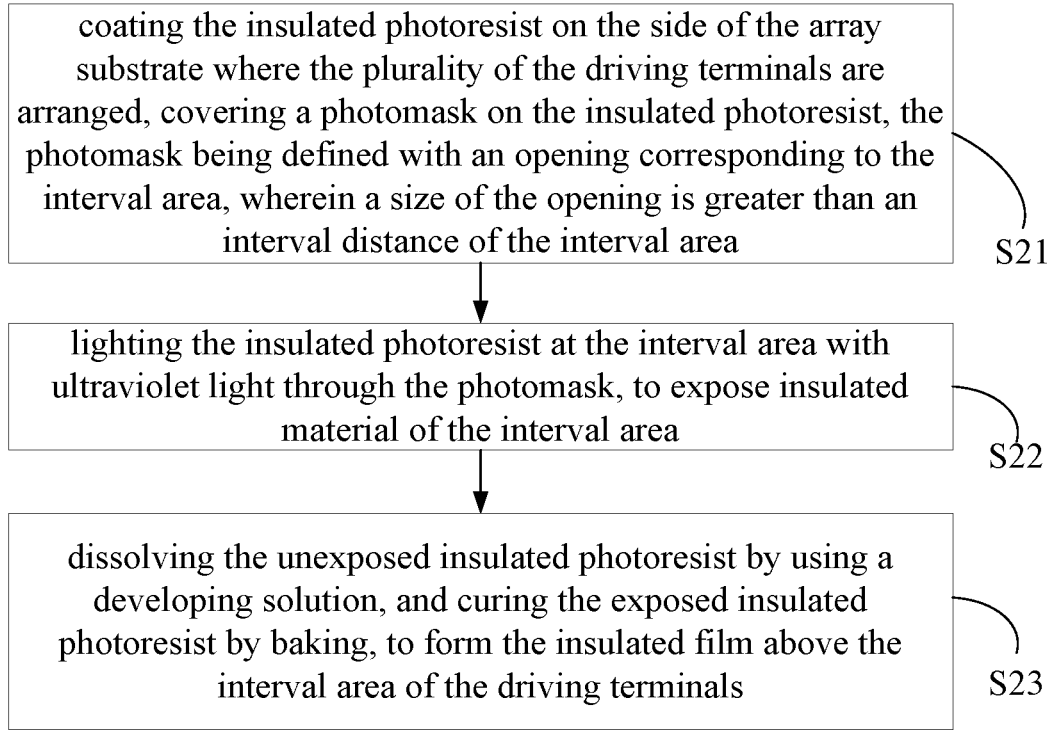
FIG. 4 is a flowchart diagram illustrating an array substrate fabrication method according to another embodiment of the present disclosure.

The realizing of the aim, functional characteristics and advantages of the present disclosure are further described in detail with reference to the accompanying drawings and the embodiments.

The technical solutions in the embodiments of the present disclosure will be described clearly and completely combining the drawings in the embodiments of the present disclosure. Obviously, the described embodiments are only a part of the embodiments of the present disclosure, but not all of them. Based on the embodiments in the present disclosure, all other embodiments obtained by those skilled in the art without creative work shall belong to the protection scope of the present disclosure.

It should be understand that, all directional indications (such as "upper", "lower", "left", "right", "front", "back" . . . ) in the embodiments of the present disclosure are only used to explain the relative positional relationship, motion, and the like, between components in a certain posture. If the particular posture changes, the directional indication changes accordingly.

In addition, terms such as "first" and "second" are used herein for purposes of description and are not intended to indicate or imply relative importance or to imply the number of indicated technical features. Thus, the features defined with "first" and "second" may comprise or imply at least one of these features. In the description of the present disclosure, "a plurality of" means two or more than two, unless specified otherwise.

FIG. 1 is a structure diagram illustrating an array substrate according to the present disclosure, and FIG. 2 is a structure diagram illustrating a driving terminal and an insulated film according to the present disclosure. Referring to FIGS. 1 to 2, the present disclosure provides an array substrate, the array substrate includes a display area 1 and a terminal area 2 defined at an edge of the display area 1.

In an embodiment, a plurality of thin film transistors 4 are arranged in the display area 1, and a plurality of driving terminals 21 are arranged at intervals in the terminal area 2. The driving terminals 21 are electrically connected with the thin film transistors 4. An insulated film 3 is arranged above an interval area of the plurality of the driving terminals 21, in order to shield the interval area.

As shown in FIG. 1, a middle area on the array substrate is the display area 1, and the A, B, C, and D areas around the display area 1 are non-display areas. The A, B, and C areas in which there are connection circuits are terminal areas 2, and the D area in which there is no connection circuit is a non-COF (Chip On Flex) area.

In an embodiment, the driving terminals 21 are arranged in the terminal area 2. As shown in FIG. 1, the array substrate is a rectangular substrate, and the A and B areas being the short sides of the rectangular substrate. In FIG. 1, only one group of the driving terminals 21 is illustrated in each of the A and B areas, and the driving terminals 21 in a same group are arranged at intervals to each other. In other embodiments, more than one group of the driving terminals 21 may be arranged in the terminal area, such as two or five groups. The number of the groups may be determined according to the length of the A and B areas, which is not limited herein.

In FIG. 1, the C area is a long side of the rectangular substrate, of which the length is longer than the length of the A area or B area. Five groups of the driving terminals 21 are illustrated in the C area. The driving terminals 21 in each group are arranged at an interval. The groups of the driving terminals 21 are arranged at a larger interval, which prevents the driving terminals 21 in each group from being electrically connected. In other embodiments, more than five groups of the driving terminals 21 may be arranged in the terminal area, such as six or seven groups. The number of groups may be determined according to the length of the C area, which is not limited herein.

In an embodiment, the array substrate may have other shapes such as square, and the number of the driving terminals 21 may be determined according to the length of the terminal area 2, which are not limited herein.

In an embodiment, a plurality of thin film transistors 4 are arranged in the display area 1. The thin film transistors are electrically connected to the driving terminals 21. The driving terminal 21 is connected to an external voltage generating device, so as to transmit the voltage generated by the voltage generating device to the thin film transistor 4. That is, the external voltage generating device applies the voltage to the thin film transistor 4 through the driving terminal 21, which enables the thin film transistor 4 to operate normally.

In an embodiment, an interval area is defined between each two driving terminals 21. And if the interval area is narrower, the thin film transistor 4 connected thereto may have more wirings, such that these wirings may be managed to be more finely, thereby improving the resolution frequency and resolution of the display area 1.

In an embodiment, since the interval area between the driving terminals 21 in each group is small, the insulated film 3 is formed above the interval area to prevent particles from falling into the interval area, thereby reducing the occurrence of short circuit between the driving terminals 21.

In the present disclosure, the array substrate includes a display area 1 and a terminal area 2 defined at the edge of the display area 1. A plurality of thin film transistors 4 are arranged in the display area 1, and a plurality of driving terminals 21 are arranged at intervals in the terminal area 2. The driving terminals 21 are electrically connected to the thin film transistors 4. An insulated film 3 is formed above the interval area of the plurality of driving terminals to shield the interval area, which can prevent particles such as dust from falling into the interval area, thereby to reduce the occurrence of short circuit between the driving terminals 21.

In an embodiment, as shown in FIG. 2, the projection of the insulated film 3 in the interval area is larger than an interval distance of the interval area. Specifically, the interval area is the distance between the two adjacent driving terminals 21 in the same group, and the width D1 of the insulated film 3 in the lateral direction is greater than the interval distance D2 of the interval area, so that the insulated film 3 can cover the interval area to for shielding the interval area.

In an embodiment, the insulated film 3 is a transparent film, and adhered on the adjacent two driving terminals 21. By this way, the two adjacent driving terminals 21 in the same group can be prevented from being electrically connected with each other with the insulated property of the insulted film 3.

In an embodiment, the insulated film 3 is a photoresist made of polytetrafluoroethylene. That is, the insulated film 3 is a Polytetrafluoroethylene (PFA) photoresist.

In an embodiment, the PFA photoresist material is coated on the upper side the driving terminals 21. The coated PFA photoresist material is exposed, developed and baked, to form an insulated film 3 on the upper side of the driving terminals 21, which prevents particles such as dust from falling into the interval area, thereby reducing the occurrence of short circuit between the driving terminals 21.

In an embodiment, an avoidance area is defined between the driving terminals 21, and a distance of the avoidance area is larger than the interval distance of the interval area. That is, the avoidance area is formed between the adjacent two groups of the driving terminals 21. For example, the terminal area 2 where the C area is located is provided with five groups of the driving terminals 21 therein, and two avoidance areas are defined between the five groups of the driving terminals 21. The distance of the avoidance area is greater than the interval distance of the interval area between the adjacent two driving terminals 21 in the same group, in order to ensure that the adjacent two groups of the driving terminals 21 are not electrically connected, thereby avoiding a short circuit.

In the present disclosure, the array substrate includes the display area 1 and the terminal area 2 which is defined at an edge of the display area 1. The plurality of thin film transistors 4 are arranged in the display area 1, and the plurality of driving terminals 21 are arranged at intervals in the terminal area 2. The driving terminal 21 is electrically connected to the thin film transistor 4. In addition, the insulated film 3 is arranged above the interval area of the plurality of driving terminals 21, in order to shield the interval area, which can prevent particles such as dust from falling into the interval area, thereby reducing the occurrence of short circuit between the driving terminals 21.

Based on the foregoing embodiments, the present disclosure further provides an embodiment of a display panel, including an array substrate.

The array substrate including a display area and a terminal area which is defined at an edge of the display area.

A plurality of thin film transistors are arranged in the display area, a plurality of driving terminals are arranged at intervals in the terminal area; and the driving terminals are electrically connected with the thin film transistors. An insulated film is arranged above an interval area of the plurality of driving terminals for shielding the interval area.

The display panel of the embodiment incorporates all the technical features of the array substrate described above, thus can achieve all the technical effects, which is not detailed herein.

FIG. 3 is a flowchart diagram illustrating an array substrate fabrication method according to an embodiment of the present disclosure. Referring to FIG. 3, the present disclosure provides an array substrate fabrication method. Based on the above embodiments, the array substrate fabrication method includes:

S10, depositing a metal layer on the array substrate, to form a plurality of driving terminals arranged at intervals in a terminal area of the array substrate; and S20, coating an insulated photoresist on a side of the array substrate where the plurality of the driving terminals are arranged, exposing, developing and baking the insulated photoresist, to form an insulated film above an interval area of the plurality of driving terminals.

In an embodiment, the metal layer is deposited on the array substrate. In this embodiment, the material of the metal layer may be tantalum, molybdenum, aluminum, copper, titanium, tantalum or tungsten, etc. The metal layer is patterned by using a photomask, in order to form the plurality of driving terminals arranged at intervals in the terminal area.

In an embodiment, as shown in FIG. 1, the middle area on the array substrate is the display area, and the A, B, C, and D areas around the display area are non-display areas. The A, B, and C areas with connection circuits included are the terminal areas, and the D area without the connection circuit is a non-COF area. The driving terminals are arranged in the A, B, and C areas.

In an embodiment, the insulated photoresist is coated on the side of the array substrate where the driving terminals are arranged. The insulated photoresist is exposed, developed, and baked, to form the insulated film above the interval area of the driving terminals.

In an embodiment, the insulated film is a photoresist made of polytetrafluoroethylene, that is, the insulated film is a polytetrafluoroethylene (PFA) photoresist.

In an embodiment, the PFA photoresist is coated on the upper side of the driving terminals, then the coated PFA photoresist is exposed, developed, and baked, in order to form the insulated film over the upper surface of the driving terminals. The insulated film can prevent particles such as dust from falling into the interval area, thereby to reduce the occurrence of short circuit between the driving terminals 21.

In an embodiment, the interval area is defined between each two of the driving terminals in the step S10. If the interval area between the driving terminals in each group is smaller, the thin film transistor connected thereto can have more wirings, and the more wirings can be arranged to be more finely, thereby to improve the resolution frequency and the resolution of the display area.

In an embodiment, the interval area between the driving terminals in each group is relatively small, and the insulated film that is formed above the interval area between the driving terminals by coating, exposing, developing, and baking the insulated photoresist can prevent particles such as dust from falling into the interval area, thereby to effectively reduce the occurrence of short circuit between the driving terminals.

In the present disclosure, a metal layer is deposited on the array substrate, to form a plurality of at intervals driving terminals in the terminal area of the array substrate. An insulated photoresist is coated on a side of the array substrate where the driving terminals are arranged, and the insulated photoresist is exposed, developed, and baked, form an insulated film above the interval area of the driving terminals. The insulated film can prevent particles such as dust from falling into the interval area, thereby reducing the occurrence of short circuit between the driving terminals.

In an embodiment, referring to FIG. 4, the step S20 further includes:

S21, coating the insulated photoresist on the side of the array substrate where the plurality of the driving terminals are arranged, covering a photomask on the insulated photoresist, the photomask being defined with an opening corresponding to the interval area, wherein, a size of the opening is greater than an interval distance of the interval area;

S22, lighting the insulated photoresist at the interval area with ultraviolet light through the photomask, to expose insulated material of the interval area; and S23, dissolving the unexposed insulated photoresist by using a developing solution, and curing the exposed insulated photoresist by baking, to form the insulated film above the interval area of the driving terminals.

In an embodiment, the insulated photoresist is coated on the side of the array substrate where the driving terminals are arranged. The photomask is arranged on the insulated photoresist, and the photomask is defined with the opening corresponding to the interval areas. The size of the opening is larger than the interval distance of the interval area.

Specifically, ways to coat the insulated photoresist include Spin Coater, Slit and Spin Coater, and Fine Slit Coater. In this embodiment, the Fine Slit Coater way is adopted, to ensure thickness uniformity of the formed insulated film. After coating the insulated photoresist on the entire array substrate, the photomask is covered on the insulated photoresist. The photomask is provided with the opening corresponding to the interval areas. The size of the opening is larger than the interval distance of the interval area, and the interval area of the driving terminals is an interval area between two adjacent driving terminals in the same group.

In an embodiment, the insulated photoresist of the interval area is irradiated with ultraviolet light through the photomask, in order to expose the insulated material of the interval area. Since the photomask is provided with the opening, that is, when the insulated photoresist is exposed to the ultraviolet light, the portion of the insulated photoresist corresponding to the opening is the exposed insulated photoresist, and the other portion is the unexposed insulated photoresist.

In an embodiment, the developing solution reacts with and dissolves the unexposed insulated photoresist, and the exposed insulated photoresist remains and is cured by baking to form the insulated film over the interval areas between the driving terminals.

In an embodiment, the developing solution is an alkaline developing solution. Optionally, the alkaline developing solution is a strong alkali developing solution of potassium hydroxide (KOH) and its derivatives. The developing solution may be other kinds of developing solutions, such as a weak alkali developer of bicarbonate and its derivatives.

In an embodiment, the unexposed insulated photoresist is dissolved in the developing solution, while the exposed insulated photoresist is retained, that is, the insulated photoresist on the interval area is retained. Then, the retained insulated photoresist is cured by baking, to form the insulated film above the interval area, which can prevent particles such as dust from falling into the interval area, thereby reducing the occurrence of short circuit between the driving terminals.

Figure 5:
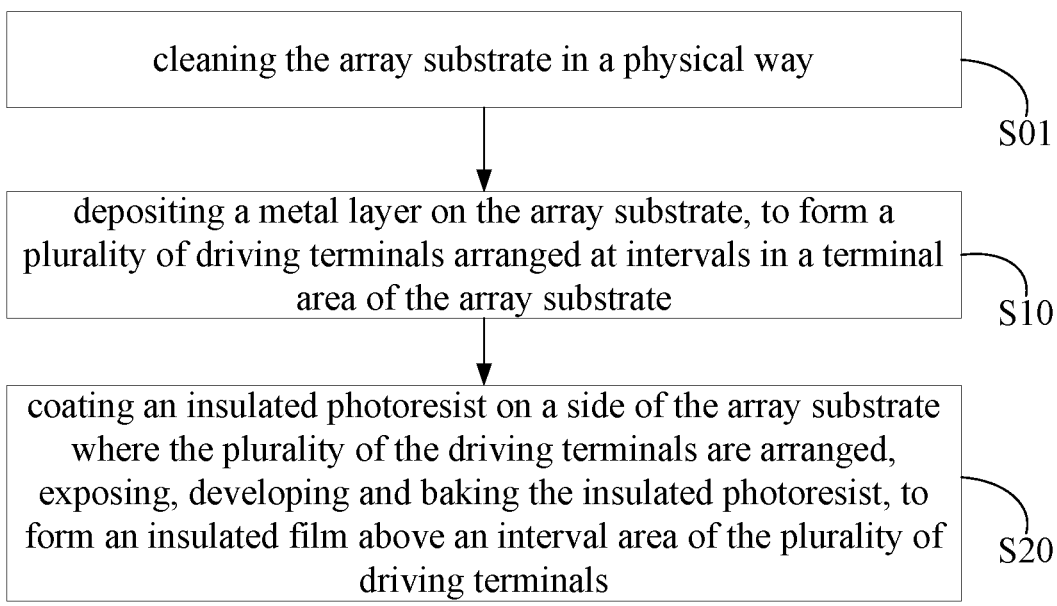
FIG. 5 is a flowchart diagram illustrating an array substrate fabrication method according to still another embodiment of the present disclosure.

In an embodiment, referring to FIG. 5, before the step S10, the method further includes:

S01, cleaning the array substrate in a physical way.

In this step, the array substrate is cleaned in a physical way before deposing the metal layer or coating the insulated photoresist on the array substrate, in order to prevent dirty on the array substrate from affecting uniformity of the deposited metal layer or the coated insulated photoresist.

In an embodiment, the array substrate may be cleaned in a physical cleaning way. The physical cleaning way includes Excimer UV cleaning, atmosphere pressure plasma cleaning, and etc., which is not limited herein.

In an embodiment, cleaning the array substrate can reduce the surface contact angle thereof, thereby to enhance the hydrophilicity of the formed insulated film and the array substrate.

Figure 6:
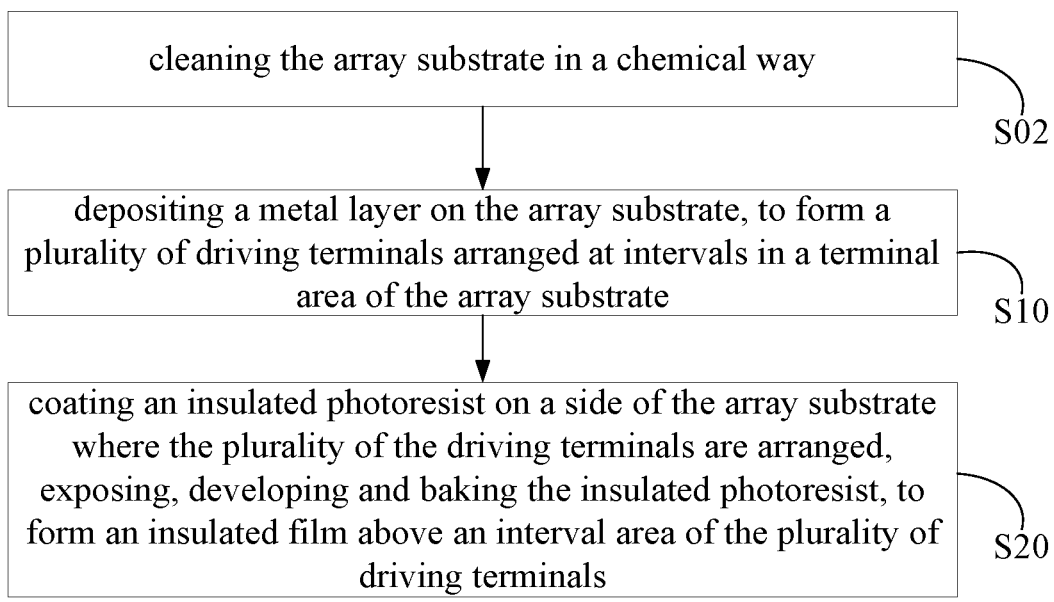
FIG. 6 is a flowchart diagram illustrating an array substrate fabrication method according to still another embodiment of the present disclosure.

In an embodiment, referring to FIG. 6, before the step S10, the method further includes:

S02, cleaning the array substrate in a chemical way.

In this step, the array substrate is cleaned by a chemical way before deposing the metal layer or coating the insulated photoresist on the array substrate, in order to prevent dirty on the array substrate from affecting uniformity of the deposited metal layer or the coated insulated photoresist.

In an embodiment, the array substrate may be cleaned in a chemical cleaning way. The chemical cleaning way includes shower, cavitation jat, and etc., which is not limited herein.

In an embodiment, cleaning the array substrate can reduce the surface contact angle thereof, thereby to enhance the hydrophilicity of the formed insulated film and the array substrate.

In the present disclosure, the metal layer is deposited on the array substrate, to form the plurality of the driving terminals at intervals in the terminal area of the array substrate. The insulated photoresist is coated on the side of the array substrate where the driving terminals are arranged, then the insulated photoresist is exposed, developed, and baked, to form the insulated film above the interval area of the driving terminals. The insulted film formed above the interval area can prevent particles such as dust from falling in the interval area, thereby reducing the occurrence of short circuit between the driving terminals.

The foregoing are only illustrative embodiments in accordance with the present disclosure and therefore not intended to limit the patentable scope of the present disclosure. Any equivalent structure or flow transformations that are made taking advantage of the specification and accompanying drawings of the disclosure and any direct or indirect applications thereof in other related technical fields are within the protection scope of the present disclosure.

What is claimed is:

1. An array substrate, comprising a display area and a terminal area defined at an edge of the display area;
    a plurality of thin film transistors being arranged in the display area, a plurality of driving terminals being arranged at intervals in the terminal area, and the plurality of driving terminals being electrically connected to the plurality of thin film transistors;
    wherein an insulated film is arranged above an interval area of two adjacent driving terminals of a group of the plurality of driving terminals, to shield the interval area;
    an avoidance area is further defined between the group of the plurality of driving terminals and another adjacent group of the plurality of driving terminals, and a distance of the avoidance area is larger than an interval distance of the interval area.

2. The array substrate of claim 1, wherein a width of a projection of the insulated film above the interval area is larger than an interval distance of the interval area.

3. The array substrate of claim 1, wherein the insulated film is a photoresist made of polytetrafluoroethylene.

4. The array substrate of claim 1, wherein the plurality of thin film transistors are connected to an external voltage generating device through the plurality of driving terminals.

5. The array substrate of claim 1, wherein the insulated film is a transparent film, and the insulated film is adhered on adjacent two of the plurality of driving terminals.

6. The array substrate of claim 1, wherein the array substrate comprises a non-display area defined around a periphery of the display area, and the terminal area is defined in the non-display area.

7. A display panel, comprising an array substrate; wherein,
    the array substrate comprises a display area and a terminal area defined at an edge of the display area;
    a plurality of thin film transistors are arranged in the display area, a plurality of driving terminals are arranged at intervals in the terminal area, and the plurality of driving terminals are electrically connected to the plurality of thin film transistors; an insulated film is arranged above an interval area of two adjacent driving terminals of a group of the plurality of driving terminals;

an avoidance area is further defined between the group of the plurality of driving terminals and another adjacent group of the plurality of driving terminals, and a distance of the avoidance area is larger than an interval distance of the interval area.

8. The display panel of claim 7, wherein a width of a projection of the insulated film above the interval area is larger than an interval distance of the interval area.

9. The display panel of claim 7, wherein the insulated film is a photoresist made of polytetrafluoroethylene.

10. The display panel of claim 7, wherein the plurality of thin film transistors are connected to an external voltage generating device through the plurality of driving terminals.

11. The display panel of claim 7, wherein the insulated film is a transparent film, and the insulated film is adhered on adjacent two of the plurality of driving terminals.

12. The display panel of claim 7, wherein the array substrate comprises a non-display area defined around a periphery of the display area, and the terminal area is defined in the non-display area.

13. An array substrate fabrication method, comprising:
depositing a metal layer on an array substrate, to form a plurality of driving terminals arranged at intervals in a terminal area of the array substrate; and
coating an insulated photoresist on a side of the array substrate where the plurality of the driving terminals are arranged, exposing, developing and baking the insulated photoresist, to form an insulated film above an interval area of the plurality of driving terminals;
wherein the operation of coating an insulated photoresist on a side of the array substrate where the plurality of the driving terminals are arranged, exposing, developing and baking the insulated photoresist, to form an insulated film above an interval area of the plurality of driving terminals comprises:
coating the insulated photoresist on the side of the array substrate where the plurality of the driving terminals are arranged, covering a photomask on the insulated photoresist, the photomask being defined with an opening corresponding to the interval area, wherein, a size of the opening is greater than an interval distance of the interval area;
lighting the insulated photoresist at the interval area with ultraviolet light through the photomask, to expose insulated material of the interval area; and
dissolving the unexposed portion of the insulated photoresist by using a developing solution, and curing the exposed portion of the insulated photoresist by baking, to form the insulated film above the interval area of the plurality of driving terminals.

14. The array substrate fabrication method of claim 13, wherein the insulated photoresist is coated by a way of fine scraping and painting.

15. The array substrate fabrication method of claim 13, wherein before the operation of depositing a metal layer on the array substrate, to form a plurality of driving terminals arranged at intervals in a terminal area of the array substrate, the array substrate fabrication method further comprise:
cleaning the array substrate in a physical way.

16. The array substrate fabrication method of claim 13, wherein before the operation of depositing a metal layer on the array substrate, to form a plurality of driving terminals arranged at intervals in a terminal area of the array substrate, the array substrate fabrication method further comprise:
cleaning the array substrate in a chemical way.

17. The array substrate fabrication method of claim 13, wherein the insulated film is a photoresist made of polytetrafluoroethylene.

* * * * *